United States Patent
LaBerge

(10) Patent No.: US 6,732,342 B2
(45) Date of Patent: May 4, 2004

(54) PLACING GATES IN AN INTEGRATED CIRCUIT BASED UPON DRIVE STRENGTH

(75) Inventor: Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 299 days.

(21) Appl. No.: 09/829,857

(22) Filed: Apr. 9, 2001

(65) Prior Publication Data

US 2001/0013114 A1 Aug. 9, 2001

Related U.S. Application Data

(63) Continuation of application No. 09/189,566, filed on Nov. 11, 1998, now Pat. No. 6,233,722.

(51) Int. Cl.$^7$ ................... G06F 17/50; H01L 25/00
(52) U.S. Cl. ................... 716/10; 716/3; 716/8
(58) Field of Search .................. 716/2, 7, 8, 9, 716/10, 11

(56) References Cited

U.S. PATENT DOCUMENTS

| | | | | |
|---|---|---|---|---|
| 5,308,798 A | * | 5/1994 | Brasen et al. | 438/129 |
| 5,552,333 A | * | 9/1996 | Cheung et al. | 438/129 |
| 5,619,418 A | * | 4/1997 | Blaauw et al. | 716/6 |
| 5,619,420 A | * | 4/1997 | Breid | 716/8 |
| 5,724,250 A | * | 3/1998 | Kerzman et al. | 716/3 |

* cited by examiner

Primary Examiner—Leigh M. Garbowski
(74) Attorney, Agent, or Firm—Park, Vaughan & Fleming LLP

(57) ABSTRACT

One embodiment of the present invention provides a system that creates a layout of a circuit by placing gates at specific locations in a circuit design based upon drive strengths and wireloads of gates in the circuit. The system operates on a gate-level description of the circuit, which includes a specification of gates in the circuit and a specification of a set of interconnections between the gates. From this gate-level description, the system obtains drive strength information for specific gates in the circuit, and uses this drive strength information as a factor in optimizing a placement for the gates in order to meet a set of timing constraints. The system may also use wireload information—in addition to the drive strength information—to place the gates. A variation on the above embodiment subsequently performs a timing-based placement operation to further optimize the drive strength-based placement. Another variation associates weights with drive strengths for individual gates. These weights are fed into a standard placement function, such as a quadratic placement function or a simulated annealing function, to produce a placement for the gates. Thus, the present invention achieves a better placement of gates than a conventional connectivity-based placement system that merely considers the number of connections to a gate.

19 Claims, 4 Drawing Sheets

PLACING GATES IN AN INTEGRATED CIRCUIT BASED UPON DRIVE STRENGTH

RELATED APPLICATION

This application is a continuation of U.S. patent application Ser. No. 09/189,566, entitled, "Placing Gates in an Integrated Circuit Based Upon Drive Strength," by inventor Paul A. LeBerge filed on Nov. 11, 1998, now U. S. Pat No. 6,233,722B1 issued May 15, 2001. This application hereby claims priority under 35 U.S.C. §120 to U.S. patent application Ser. No. 09/189,566.

BACKGROUND

1. Field of the Invention

The present invention relates to computer-aided design tools for electrical circuits, and more particularly to a system for placing gates at specific locations in a circuit design based upon drive strengths and wireloads of the gates.

2. Related Art

Circuit design is presently accomplished primarily through the use of computer aided design (CAD) tools, which take as input a circuit specification and automatically generate circuit descriptions suitable for implementation. Circuits are initially specified in a hardware description language, such as VHDL or Verilog. The VHDL standard is codified in Institute for Electrical and Electronic Engineers (IEEE) standard 1076-1993, and the Verilog standard is codified in IEEE standard 1364-1995.

A hardware description language (HDL) specification of a circuit typically includes a set of equations that specify how the circuit behaves functionally. These equations are "synthesized" into a gate-level implementation of the circuit, which specifies what logic gates are used to implement the circuit as well as the interconnections between the logic gates. After the circuit is synthesized into a gate-level implementation, the system typically performs a "placement" operation to place gates at specific locations on a semiconductor die. Next, the system performs a "routing" operation to rout the interconnections between the gates. Note that the "routing" operation is presently becoming less of a performance impediment than the "placement" operation, because modern circuit technologies provide multiple signal layers. This makes it easier to rout interconnections and makes it possible to create "feed throughs," to pass signal lines through other gates, instead of around them.

As new semiconductor processing technologies push geometries below 0.5 microns, circuit timing is beginning to be dominated by wireload and wire delay instead of gate delay. This change has significant implications for the optimizations currently performed by existing CAD tools.

Existing CAD systems typically perform placement in one of two ways. (1) Timing-based placement iteratively simulates timing for the circuit and adjusts the placement to meet timing requirements. This tends to produce a good placement. However, the timing simulations can run for days or weeks, which can be an unacceptably long time. (1) Connectivity-based placement considers the number of connections to a gate. For example, if a gate has three input lines and a single output line, a connectivity-based placement scheme gives the three input lines a greater weight than the single output line in deciding where to place the gate. This tends to pull the gate toward the three input lines, thus shortening the three input lines and lengthening the output line. Connectivity-based placement requires significantly less computational time than timing-based placement. However, it tends to produce a less optimal placement. Furthermore, connectivity-based placement will become less accurate as wireloads begin to dominate timing delays. What becomes more significant is the wireload on a signal line and the drive strength of a gate that is driving the signal line.

What is needed is a CAD system that takes into account gate drive strengths and/or wireloads in placing gates at specific locations in a semiconductor chip design.

SUMMARY

One embodiment of the present invention provides a system that creates a layout of a circuit by placing gates at specific locations in a circuit design based upon drive strengths and wireloads of gates in the circuit. The system operates on a gate-level description of the circuit, which includes a specification of gates in the circuit and a specification of a set of interconnections between the gates. From this gate-level description, the system obtains drive strength information for specific gates in the circuit, and uses this drive strength information as a factor in optimizing a placement for the gates in order to meet a set of timing constraints. The system may also use wireload information—in addition to the drive strength information—to place the gates. A variation on the above embodiment subsequently performs a timing-based placement operation to further optimize the drive strength-based placement. Another variation associates weights with drive strengths for individual gates. These weights are fed into a standard placement function, such as a quadratic placement function or a simulated annealing function, to produce a placement for the gates. Thus, the present invention achieves a better placement of gates than a conventional connectivity-based placement system that merely considers the number of connections to a gate.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital video discs), and computer instruction signals embodied in a carrier wave. For example, the carrier wave may originate from a communications network, such as the Internet.

Computer System

Figure 1:
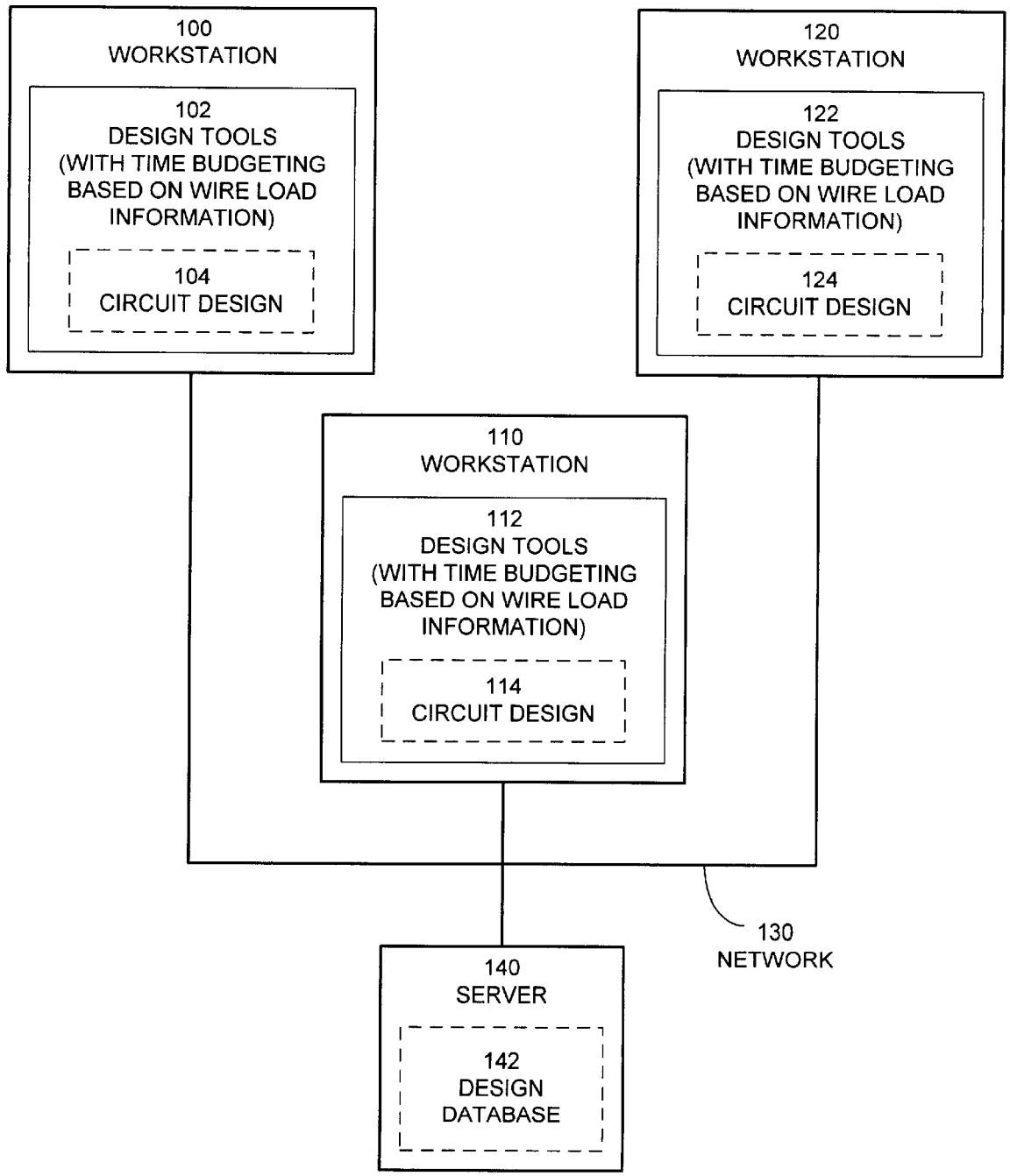
FIG. 1 illustrates a computer system including computer-aided design tools accordance with an embodiment of the present invention.

FIG. 1 illustrates a computer system including computer-aided design (CAD) tools in accordance with an embodiment of the present invention. The computer system illustrated in FIG. 1 includes a plurality of workstations 100, 110 and 120 coupled together through network 130 to server 140. Workstations 100, 110 and 120 may be any type of computing system on which CAD tools may operate. This includes, but is not limited to, workstations, personal computers, mainframe computers, supercomputers and portable computers. Network 130 may be any type of communication network through which computers can communicate. This includes, but is not limited to, local area networks, such as Ethernet or Token ring networks, and wide area networks, such as the Internet. Server 140 is any type of computational server capable of storing code and data that can be accessed by other computer systems over network 130.

Workstation 100 includes design tools 102, which include computer-aided design (CAD) tools for designing electrical circuitry. In one embodiment of the present invention, design tools 102 are configured to design integrated circuits. To this end, design tools 102 may include tools to perform synthesis, placement and routing of logic circuits, as well as tools to simulate and test the logic circuits. In the illustrated embodiment, design tools 102 include a circuit design 104. Circuit design 104 may initially assume the form of a hardware description language specification of a circuit, which is ultimately compiled into a gate-level implementation. Workstation 110 similarly includes corresponding design tools 112, which include a corresponding circuit design 114. Workstation 120 also includes corresponding design tools 122, which include corresponding circuit design 124.

FIG. 1 illustrates a system with three workstations, 100, 110 and 120 coupled to server 140. However, the present invention is applicable to systems including any number of workstations. Alternatively, the present invention may operate in a stand-alone computer system, such as a workstation, a personal computer, or a mainframe computer.

Server 140 includes a data storage medium for storing shared data. In one embodiment, this takes the form of a plurality of magnetic disk drives. Server 140 also includes design database 142, which is any type of database system that permits access by multiple users. Design database 142 may include designs for modules of a circuit, which are ultimately used to design a complete circuit.

Placement Functional Modules

Figure 2:
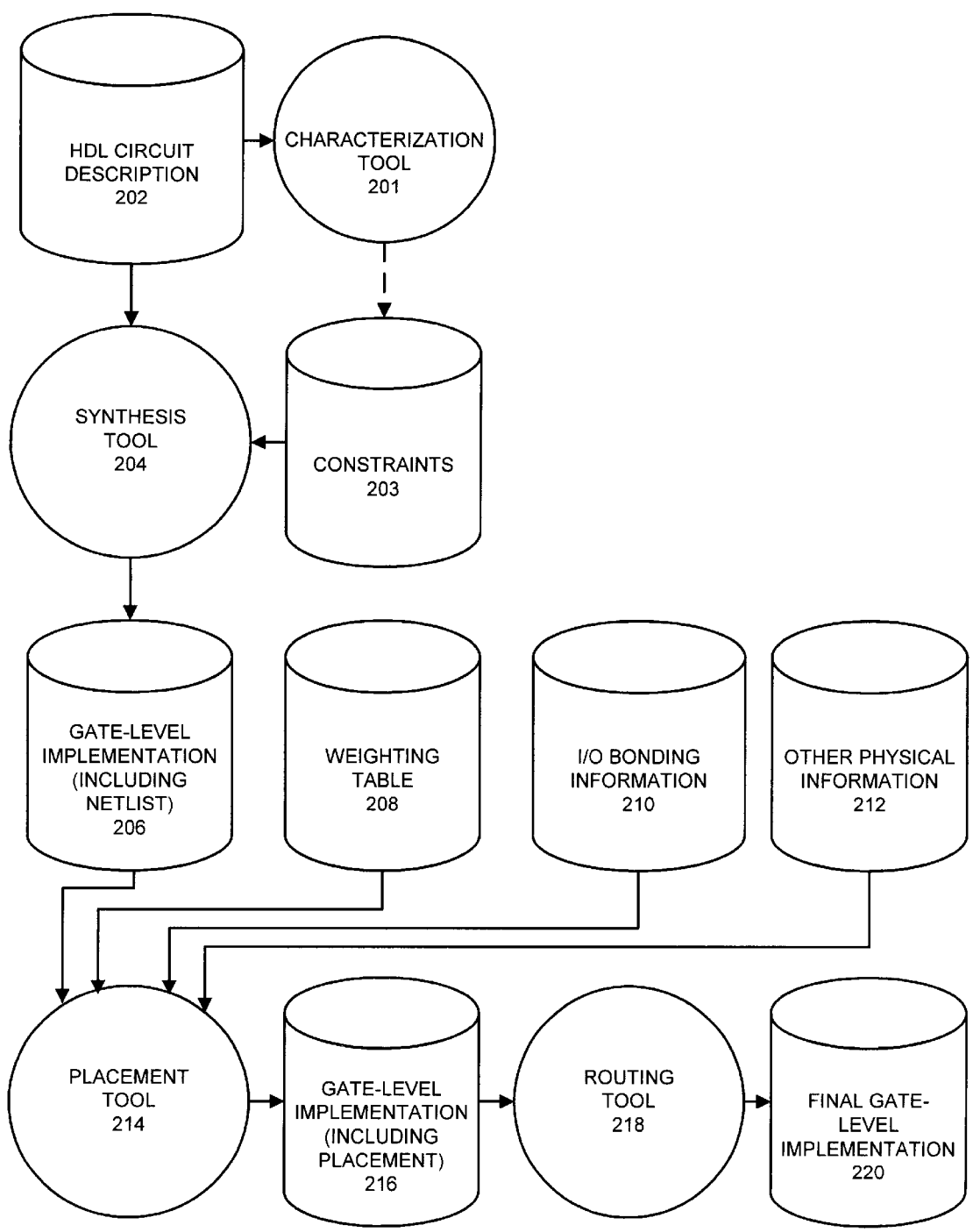
FIG. 2 illustrates some of the major functional modules involved in the placement process in accordance with an embodiment of the present invention.

FIG. 2 illustrates some of the major functional modules involved in the placement process in accordance with an embodiment of the present invention. The circuit starts in HDL format, which is illustrated by HDL circuit description 202. HDL circuit description 202 may be represented in a number of HDL formats, including Verilog or VHDL. Alternatively, the circuit may be described in an internal representation derived from a HDL description. For example, the circuit may be described in the ".db" format, which is an internal representation specific to SYNOPSYS™ computer-aided circuit design tools. Synopsys is a trademark of the Synopsys, Inc. of Mountain View, Calif.

HDL circuit description 202 is combined with constraints 203 in synthesis tool 204. Constraints 203 include a set of constraints that can specify both high-level and low-level constraints for the circuit. For example, constraints 203 may specify low-level timing constraints on individual signal lines that couple together various modules of the circuit. At a high-level, constraints 203 may specify a global clock speed for the circuit. In general, constraints 203 may specify any type of design constraint applicable to the circuit.

The initial values for constraints 203 may be set by default, or alternatively, by estimating a first set of timing constraints by examining logic equations for the circuit. This process of estimation is performed by characterization tool 201, which takes HDL circuit description 202 as input and produces an initial set of constraints, which feeds into constraints module 203.

Synthesis tool 204 uses HDL circuit description 202 and constraints 203 to create gate-level implementation 206. Gate-level implementation 206 specifies a collection of logic gates that implement the logic equations specified in HDL circuit description 202. Gate level implementation 206 additionally specifies interconnections between the logic gates, which are sometimes collectively referred to as a "netlist." In producing a gate-level implementation 206, synthesis tool 204 attempts to meet any constraints specified in constraints module 203.

Gate-level implementation 206 feeds into placement tool 214, which performs gate placement in accordance with an embodiment of the present invention. During operation, placement tool 214 additionally takes as input weighting table 208, I/O bonding information 210 and other physical information 212.

Weighting table 208 includes weighting factors for gates, which are indexed by the drive strengths of the gates, or alternatively by gate types. These weighting factors give a gate with small drive strength a larger factor. This larger factor indicates that the placement function should try to minimize the length of signal paths originating from the output of the gate, because these signal path are likely to create performance problems. In one embodiment of the present invention, this weighting factor is multiplied by the number of connections from the output of the gate, and this product is used by a standard placement function to place the associated gates. In another embodiment, the weighting factor for a gate is not retrieved from weighting table 208, but is instead calculated by applying a function to the drive strength of the associated gate.

I/O bonding information 210 contains specific information about die size and parameters associated with the position and size of I/O bonding pads. This information is typically obtained from an application-specific integrated circuit (ASIC) vendor. Other physical information 212 includes other physical parameters associated with the placement process including, for example, parameters specifying geometries for different gates.

Placement tool 214 uses the above-described inputs to produce gate-level implementation 216, which includes placement information for gates. Next, gate-level implementation 216 is fed through routing tool 218, which routes all of the interconnections between gates in gate level implementation 216 to produce a final gate-level implementation 220, which includes both placement and routing information.

Figures 3, 4:
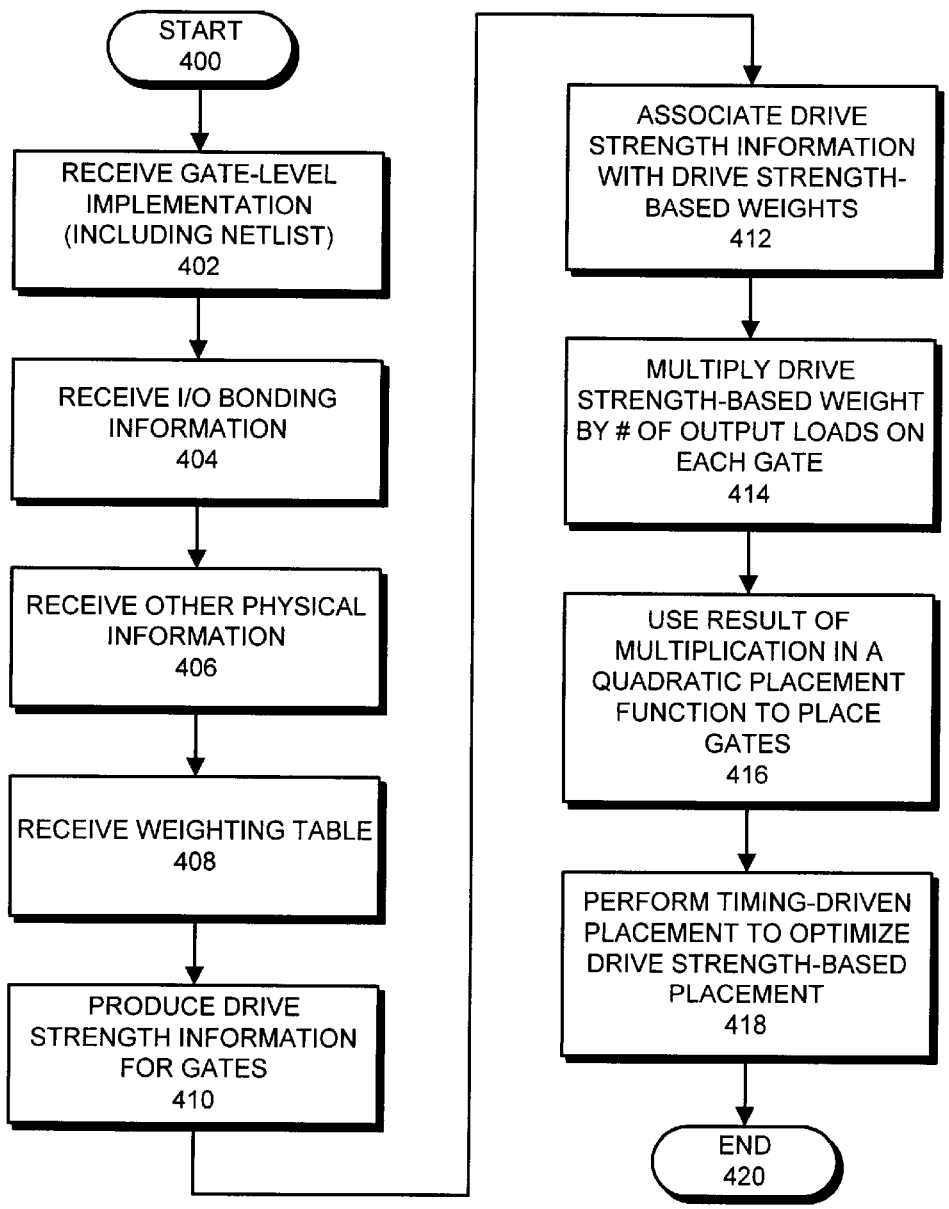
FIG. 3 illustrates a table including weights associated with various gate drive strengths in accordance with an embodiment of the present invention.
FIG. 4 presents a flow chart illustrating the drive strength-based placement process in accordance with an embodiment of the present invention.

FIG. 3 illustrates a table including weights associated with various gate drive strengths in accordance with an embodiment of the present invention. More specifically, FIG. 3 represents a possible embodiment of weighting table 208 from FIG. 2. The table in FIG. 3 includes a set of weights 2.2, 2.0, 1.7, 1.4, 1.2 and 1.0, which are associated with gate drive strengths A, B, C, D, E and F, respectively. As mentioned above, a smaller drive strength (an "A" for example) is typically associated with a larger weight because signal lines driven by less powerful drivers tend to have more timing problems, and should hence be shortened if possible.

Placement Process

FIG. 4 presents a flow chart illustrating the drive strength-based placement process in accordance with an embodiment of the present invention. The system starts by receiving a gate-level implementation 206 of the circuit, including a netlist specifying interconnections between gates in the circuit (step 402). The system additionally receives I/O bonding information 210, which includes information on the physical locations and geometries of bonding pads as well as the die size (step 404). The system also receives other physical information 212 specifying physical attributes of the gates, such as gate geometries (step 406). In addition to the above information, the system receives information from weighting table 208 specifying weights to be associated with different drive strengths of the gates (step 408).

Next, the system uses the above-received information to determine drive strength information for individual gates in the circuit (step 410). In one embodiment of the present invention, this drive strength information is embedded in gate-level implementation 206, and the system merely retrieves this drive strength information from gate level-implementation 206. In another embodiment, the system looks up drive strength information for specific gates in at least one table containing drive strength information for different gate types.

The system next associates weights from weighting table 208 with drive strengths for particular gates (step 412). In one embodiment of the present invention, these weights are indexed by drive strength as in FIG. 3. In another embodiment, these weights are indexed by gate type. Note that if the weights are indexed by gate type, it is no longer necessary to perform the intermediate step 410 of producing gate drive strength information.

Next, for each gate, the system multiplies the associated weighting factor by the number of outputs to the gate (step 414). The result of this multiplication is used in a standard placement function, such as a quadratic placement function or a simulated annealing function, to place the gates (step 416).

After the drive strength-based placement is produced, the system additionally performs a more time-consuming timing-driven placement to further optimize the placement (step 418).

Example

Figure 5A:
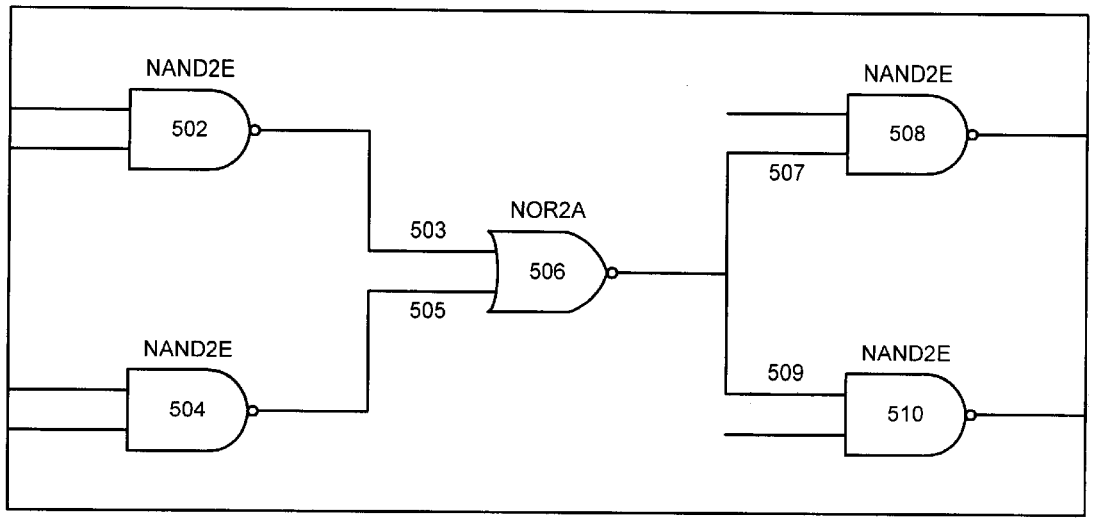
FIG. 5A illustrates an example placement of a circuit created without considering gate drive strength.

FIG. 5A illustrates an example circuit placement created without considering gate drive strength. In this example, two-input NOR gate 506 takes inputs from the outputs of two-input NAND gates 502 and 504. The output of two-input NOR gate 506 feeds into inputs of two-input NAND gate 508 and two-input NAND gate 510. In placing NOR gate 506, a connectivity-based placement system simply considers the fact that NOR gate 506 has an equal number of inputs and outputs. This results in placement of NOR gate 506 midway between NAND gates 502 and 504 and NAND gates 508 and 510.

Note that this placement is not optimal because NOR gate 506 has a smaller "A" driver with which to drive output signal lines 507 and 509, whereas the input signal lines 503 and 505 to NOR gate 502 are driven by larger "E" drivers from NAND gates 502 and 504, respectively. Hence, the delays on output signal lines 507 and 509 will be larger than the delays on input signal lines 503 and 505.

Figure 5B:
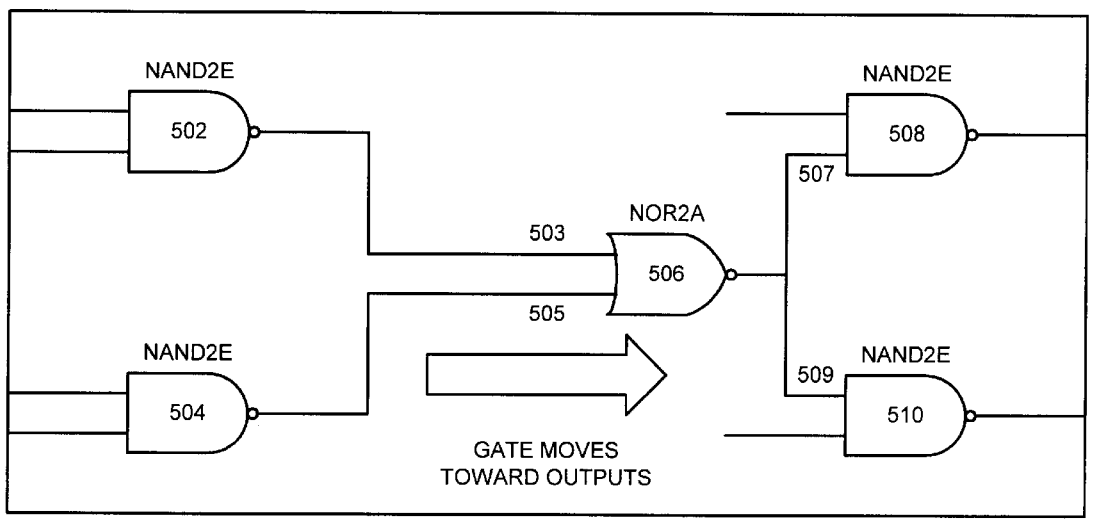
FIG. 5B illustrates an example placement of a circuit created by considering gate drive strength in accordance with an embodiment of the present invention.

FIG. 5B illustrates an example circuit placement created by considering gate drive strengths in accordance with an embodiment of the present invention. In this embodiment, the system determines the drive strengths for inputs 503 and 505 to NOR gate 506. Inputs 503 and 505 are driven by larger "E" drivers from NAND gates 502 and 504, respectively. The system first looks up the weighting factor of 1.2 for the E drivers in the table in FIG. 3, and multiplies this weighting factor by the two inputs 503 and 505 to produce a total input weight of 2.4. The system next looks up the weighting factor of 2.2 for the "A" output driver of NOR gate 506, and multiplies this weighting factor by the two outputs 507 and 509 to produce a total output weight of 4.4. The total input weight of 2.4 and total output weight of 4.4 are fed into a placement function, which tends to move NOR gate 506 towards the output side because of the larger total output weight.

Note that this example only illustrates one possible set of functions for determining weighting factors. In general, any set of functions that considers drive strength may be used. Additionally, the functions may take into account the actual capacitive load and/or resistive load on signal lines.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for placing gates at specific locations in a layout of a circuit to produce a drive strength-based placement of the circuit, comprising:

receiving a description of the circuit, the description including a specification of a set of gates included in the circuit and a specification of a set of interconnections between the set of gates;

producing drive strength information for specific gates in the set of gates;

optimizing a placement for the set of gates using the drive strength information, wherein running the optimization function for a specific gate includes:

multiplying the drive strength-based weight for the specific gate by a number of outputs from the specific gate, and using a result of the multiplication to optimize the drive strength-based placement for the set of gates; and placing specific gates in the set of gates at the optimized locations in the layout of the circuit based upon drive strengths and wireloads of gates in the circuit to produce a drive strength-based placement of the circuit, wherein the act of placing the specific gates includes associating the drive strength information with drive strength-based weights for the specific gates.

2. The method of claim 1, wherein associating the drive strength information with drive strength-based weights for the specific gates includes looking up the drive-strength based weights in a table.

3. The method of claim 1, wherein associating the drive strength information with drive strength-based weights for the specific gates includes using a function to calculate the drive strength-based weights from the drive strength information.

4. The method of claim 1, wherein producing the drive strength information includes looking up the drive strength information in at least one table containing drive strength information for different types of gates in the circuit.

5. The method of claim 1, wherein producing the drive strength information includes retrieving the drive strength information from the description of the circuit.

6. The method of claim 1, wherein receiving the description of the circuit includes receiving information on die size and I/O pad placement for the circuit.

7. The method of claim 1, wherein receiving the specification of the set of interconnections includes receiving a netlist specifying the set of interconnections.

8. The method of claim 1, further comprising performing a timing-driven placement operation, which further optimizes the drive strength-based placement using information obtained from at least one timing simulation of the circuit.

9. The method of claim 1, wherein the act of placing the specific gates based upon the drive strength information includes using wireload information to place the specific gates.

10. The method of claim 1, wherein the act of placing the specific gates based upon the drive strength information includes using a quadratic placement function to place the specific gates.

11. The method of claim 1, wherein the act of placing the specific gates based upon the drive strength information includes using a simulated annealing function to place the specific gates.

12. A method for placing gates at specific locations in a layout of a circuit to produce a drive strength-based placement of the circuit, comprising:
    receiving a description of the circuit, the description including a specification of a set of gates included in the circuit, a netlist specifying of a set of interconnections between the set of gates, and information on die size and I/O pad placement for the circuit;
    producing drive strength information for specific gates in the set of gates by looking up the drive strength information in at least one table containing drive strength information for different types of gates in the circuit;
    associating the drive strength information with drive strength-based weights for the specific gates;
    optimizing a placement for the set of gates using the drive strength information;
    placing the specific gates at the optimized locations in the layout of the circuit based upon drive strengths and wireloads of gates in the circuit to produce a drive strength-based placement of the circuit, wherein the act of placing specific gates based upon the drive strength-based weights includes:
        multiplying the drive strength-based weight for the specific gate by a number of outputs from the specific gate, and
        using a result of the multiplication to optimize the drive strength-based placement for the set of gates; and
    performing a timing-driven placement operation, which further optimizes the drive strength-based placement using information obtained from at least one timing simulation of the circuit.

13. The method of claim 12, wherein associating the drive strength information with drive strength-based weights for the specific gates includes looking up the drive-strength based weights in a table.

14. The method of claim 12, wherein associating the drive strength information with drive strength-based weights for the specific gates includes using a function to calculate the drive strength-based weights from the drive strength information.

15. The method of claim 12, wherein the act of placing the specific gates includes using a quadratic placement function to place the specific gates.

16. The method of claim 12, wherein the act of placing the specific gates includes using a simulated annealing function to place the specific gates.

17. A computer readable storage medium storing instructions that when executed by a computer cause the computer to perform a method for placing gates at specific locations in a layout of a circuit to produce a drive strength-based placement of the circuit, comprising:
    receiving a description of the circuit, the description including a specification of a set of gates included in the circuit and a specification of a set of interconnections between the set of gates;
    producing drive strength information for specific gates in the set of gates;
    optimizing a placement for the set of gates using the drive strength information; and
    placing specific gates in the set of gates at the optimized locations in the layout of the circuit based upon drive strengths and wireloads of gates in the circuit to produce a drive strength-based placement of the circuit, wherein the act of placing specific gates based upon the drive strength-based weights includes:
        multiplying the drive strength-based weight for the specific gate by a number of outputs from the specific gate, and
        using a result of the multiplication to optimize the drive strength-based placement for the set of gates.

18. An apparatus that places gates at specific locations in a layout of a circuit to produce a drive strength-based placement of the circuit, comprising:
    a receiving mechanism that receives a description of the circuit, the description including a specification of a set of gates included in the circuit and a specification of a set of interconnections between the set of gates;
    a drive strength determination mechanism that produces drive strength information for specific gates in the set of gates;
    an optimization mechanism that optimizes a placement for the set of gates using the drive strength-based weights, wherein the optimization mechanism is configured to multiply the drive strength-based weight for a specific gate by a number of outputs from the specific gate, and to use a result of the multiplication to optimize the drive strength-based placement for the set of gates; and
    a placement mechanism that places specific gates in the set of gates at the optimized locations in the layout of the circuit based upon drive strengths and wireloads of gates in the circuit to produce a drive strength-based placement of the circuit, wherein the placement mechanism includes an association mechanism that associates the drive strength information with drive strength-based weights for the specific gates.

19. The apparatus of claim 18, wherein the placement mechanism is configured to further perform a timing-driven placement operation, which further optimizes the drive strength-based placement using information obtained from at least one timing simulation of the circuit.

* * * * *